United States Patent
Harada

(10) Patent No.: US 11,004,964 B2
(45) Date of Patent: May 11, 2021

(54) SEMICONDUCTOR DEVICE

(71) Applicant: Mitsubishi Electric Corporation, Tokyo (JP)

(72) Inventor: Tatsuo Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/592,614

(22) Filed: Oct. 3, 2019

(65) Prior Publication Data

US 2020/0194574 A1 Jun. 18, 2020

(30) Foreign Application Priority Data

Dec. 17, 2018 (JP) .............................. JP2018-235379

(51) Int. Cl.
*H01L 21/00* (2006.01)
*H01L 29/739* (2006.01)

(52) U.S. Cl.
CPC ................................ *H01L 29/7397* (2013.01)

(58) Field of Classification Search
CPC ............. H01L 29/7397; H01L 29/0696; H01L 29/0619
See application file for complete search history.

(56) References Cited

U.S. PATENT DOCUMENTS

| | | | | |
|---|---|---|---|---|
| 5,864,159 A * | 1/1999 | Takahashi | ............. | H01L 29/407 257/330 |
| 6,118,150 A * | 9/2000 | Takahashi | ........... | H01L 29/0696 257/341 |
| 10,008,592 B1 * | 6/2018 | Kojima | ............... | H01L 29/7811 |
| 2001/0026977 A1 * | 10/2001 | Hattori | ................ | H01L 29/7393 438/268 |
| 2002/0088991 A1 * | 7/2002 | Hisamoto | ........... | H01L 27/0629 257/172 |
| 2007/0267663 A1 * | 11/2007 | Harada | ............... | H01L 29/7397 257/288 |
| 2009/0020852 A1 * | 1/2009 | Harada | ............... | H01L 29/7397 257/579 |
| 2009/0283798 A1 * | 11/2009 | Tsuzuki | ............ | H01L 29/66734 257/140 |
| 2015/0349103 A1 * | 12/2015 | Onozawa | ............ | H01L 29/0696 257/144 |
| 2017/0005185 A1 * | 1/2017 | Nagata | ............... | H01L 29/66348 |
| 2017/0018635 A1 * | 1/2017 | Tsuyuki | ............... | H01L 29/0619 |
| 2017/0054010 A1 * | 2/2017 | Matsuura | .............. | H01L 29/407 |
| 2017/0092750 A1 * | 3/2017 | Nagata | ................ | H01L 29/1095 |

(Continued)

FOREIGN PATENT DOCUMENTS

JP 2001-250947 A 9/2001
WO WO-2019097836 A1 * 5/2019 ......... H01L 29/1095

*Primary Examiner* — Laura M Menz
(74) *Attorney, Agent, or Firm* — Studebaker & Brackett PC

(57) ABSTRACT

A semiconductor device includes: a second semiconductor layer in a surface layer of a first semiconductor layer; a third semiconductor layer in a surface layer of the second semiconductor layer; a first trench penetrating the second semiconductor layer and the third semiconductor layer to reach an inside of the first semiconductor layer; a second trench penetrating, from an upper surface of the first semiconductor layer, the third semiconductor layer to reach an inside of the second semiconductor layer; and a fourth semiconductor layer in contact with a bottom of the second trench.

11 Claims, 11 Drawing Sheets

(56) References Cited

U.S. PATENT DOCUMENTS

| | | | |
|---|---|---|---|
| 2017/0294527 A1* | 10/2017 | Suzuki | H01L 21/265 |
| 2018/0248003 A1* | 8/2018 | Nakamura | H01L 29/66128 |
| 2019/0006495 A1* | 1/2019 | Ogura | H01L 29/0619 |
| 2019/0035920 A1* | 1/2019 | Nagata | H01L 29/1095 |
| 2019/0140084 A1* | 5/2019 | Shirakawa | H01L 29/417 |
| 2019/0296133 A1* | 9/2019 | Iwakaji | H01L 21/765 |
| 2020/0105873 A1* | 4/2020 | Blanchard | H01L 29/36 |
| 2020/0161457 A1* | 5/2020 | Takahashi | H01L 29/423 |
| 2020/0161460 A1* | 5/2020 | Harada | H01L 29/0619 |
| 2020/0194574 A1* | 6/2020 | Harada | H01L 29/7397 |
| 2020/0212208 A1* | 7/2020 | Sin | H01L 29/0804 |

\* cited by examiner

F I G. 7
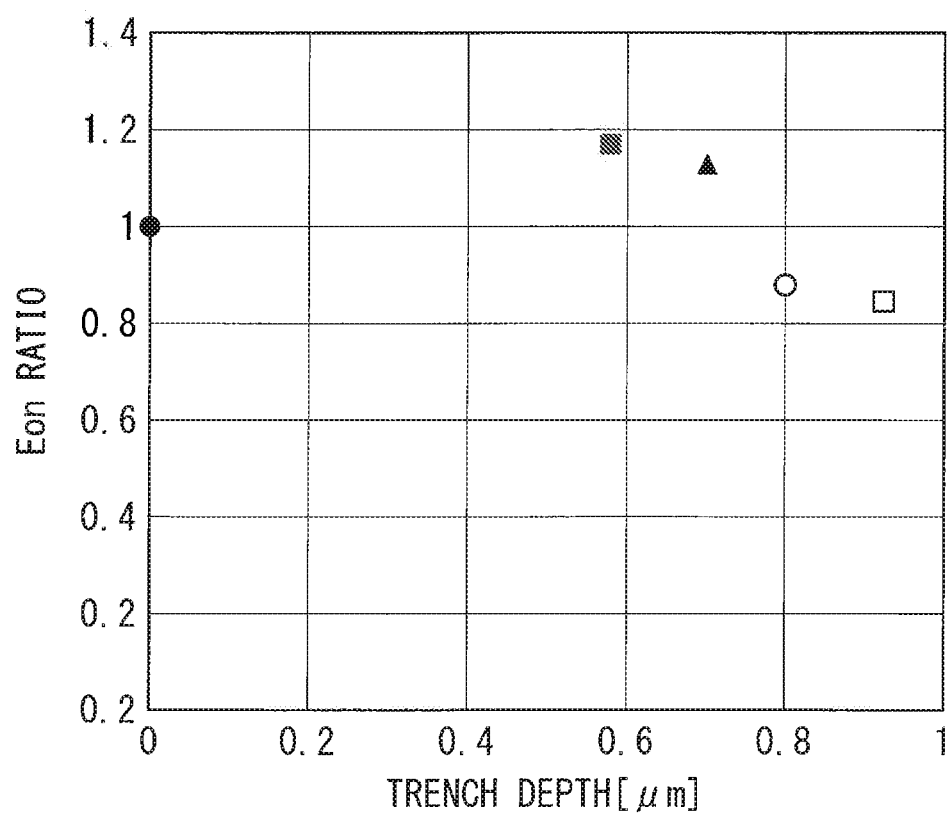

SEMICONDUCTOR DEVICE

BACKGROUND OF THE INVENTION

Field of the Invention

Technology disclosed in the present application relates to semiconductor devices.

Description of the Background Art

In an insulated gate bipolar transistor (IGBT) having a trench gate structure as exemplified in Japanese Patent Application Laid-Open No. 2001-250947, for example, a method of increasing a threshold voltage has typically been taken to suppress a saturation current to thereby improve short-circuit capability.

As described above, measures to suppress the saturation current to thereby improve the short-circuit capability have been taken in conventional technology, but have not yet been sufficient.

SUMMARY

It is an object of technology disclosed in the present application to provide technology for suppressing a saturation current to improve short-circuit capability in a semiconductor device.

The technology disclosed in the present application includes: a first semiconductor layer of a first conductivity type; a second semiconductor layer of a second conductivity type in a surface layer of the first semiconductor layer, a third semiconductor layer of the first conductivity type in a surface layer of the second semiconductor layer; at least one first trench penetrating, from an upper surface of the first semiconductor layer, the second semiconductor layer and the third semiconductor layer to reach an inside of the first semiconductor layer; a gate dielectric on an inner wall of the first trench; a gate electrode inside the gate dielectric in the first trench; an interlayer dielectric covering the gate electrode; at least one second trench penetrating, from a part of the upper surface of the first semiconductor layer exposed from the interlayer dielectric, the third semiconductor layer to reach an inside of the second semiconductor layer; a fourth semiconductor layer of the second conductivity type in contact with a bottom of the second trench; and an electrode layer covering the interlayer dielectric and the second trench.

According to the technology disclosed in the present application, the saturation current can be suppressed to improve the short-circuit capability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram showing a correlation between the depth of a contact trench from a lower surface of an $n^+$-type semiconductor layer and a turn-on loss ratio at a rated current in the semiconductor device illustrated in FIG. 3, the semiconductor device illustrated in FIG. 4, and the semiconductor device illustrated in FIG. 5;

DESCRIPTION OF THE PREFERRED EMBODIMENTS

Embodiments will be described below with reference to the accompanying drawings. Examples of the effects produced in the respective embodiments will be described together after description of all the embodiments.

The drawings are schematically shown, and configurations are omitted or simplified as appropriate for the convenience of description. The sizes of and a positional relationship among configurations illustrated in different drawings are not necessarily accurate, and can be changed as appropriate. Hatching may be applied to drawings other than a sectional view, such as a plan view, for ease of understanding of the embodiments.

In description made below, similar components bear the same reference signs, and have similar names and functions. Detailed description thereof may thus be omitted to avoid redundancy.

In description made below, terms representing specific locations and directions, such as "upper", "lower", "left", "right", "side", "bottom", "front", and "back", may be used. These terms, however, are used for the sake of convenience for ease of understanding of the embodiments, and do not relate to directions in actual use.

In description made below, descriptions "an upper surface of . . . " or "a lower surface of . . . " include not only "an upper surface (or a lower surface) of a target component itself" but also a state of another component being formed on the upper surface (or the lower surface) of the target component. That is to say, a description "A provided on an upper surface of B" does not prevent another component "C" from being interposed between A and B.

In description made below, ordinal numbers, such as "first" and "second", may be used. The ordinal numbers, however, are used for the sake of convenience for ease of understanding of the embodiments, and an order and the like are not limited to an order represented by the ordinal numbers.

First Embodiment

A semiconductor device according to the present embodiment will be described below.

<Configuration of Semiconductor Device>

Figure 1:
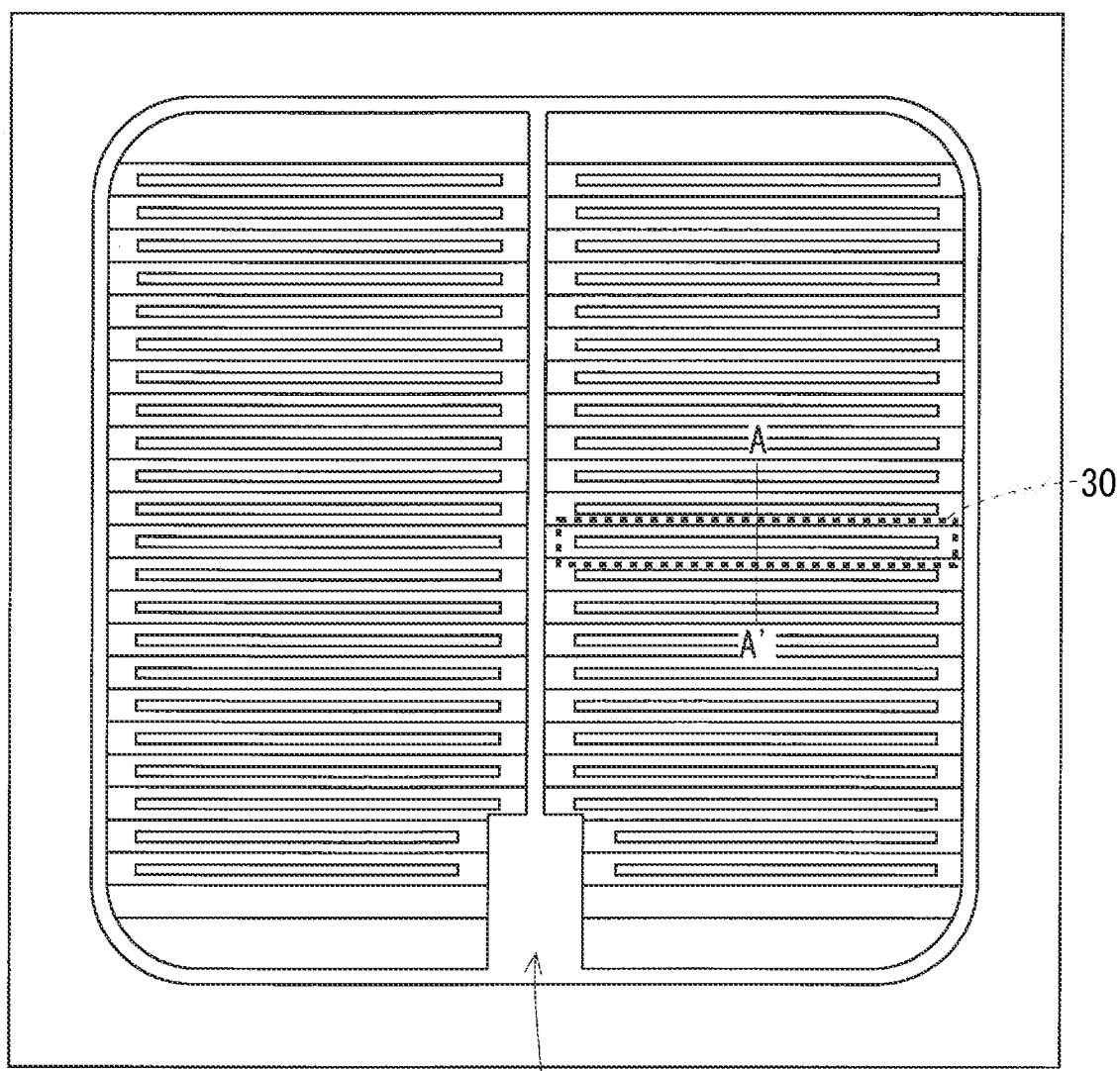
FIG. 1 is a plan view schematically showing an example of a configuration of a semiconductor device according to an embodiment.
Figure 2:
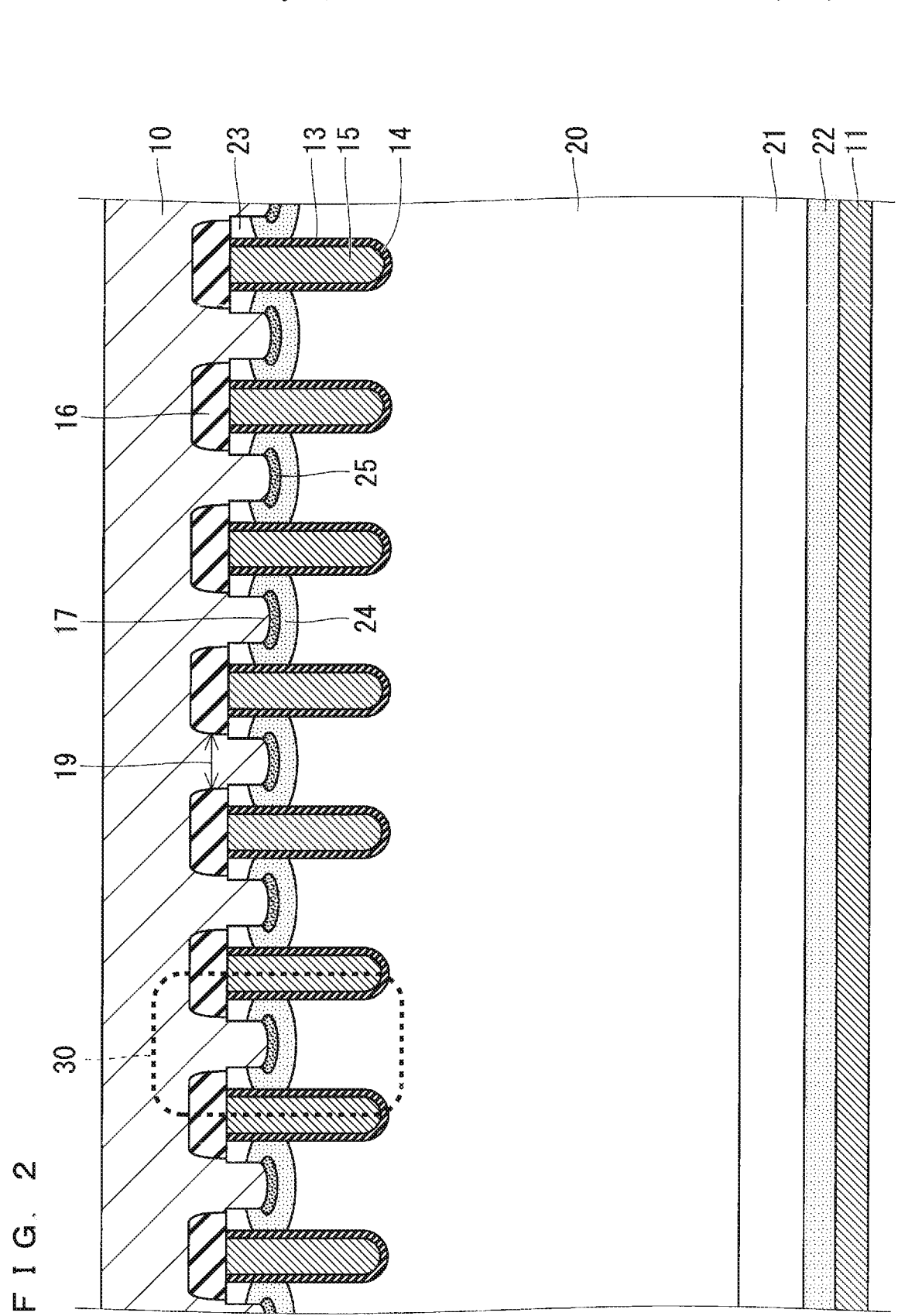
FIG. 2 is a sectional view taken along a line A-A' of FIG. 1.

FIG. 1 is a plan view schematically showing an example of a configuration of the semiconductor device according to the present embodiment. FIG. 2 is a sectional view taken along a line A-A' of FIG. 1.

As illustrated in FIG. 1, the semiconductor device includes an array of a plurality of cell regions 30 and a gate pad 18 disposed at the periphery of the array of the cell regions 30. Configurations of the cell regions 30 will be described below.

As illustrated in FIG. 2, the semiconductor device includes an n-type semiconductor substrate 20. The n-type semiconductor substrate 20 is made of Si, and has a first main surface (an upper surface in FIG. 2) and a second main surface (a lower surface in FIG. 2) opposing each other.

A p-type semiconductor layer 24 (a base layer) is formed in a surface layer on a side of the upper surface of the n-type semiconductor substrate 20. An $n^+$-type semiconductor layer 23 (an emitter layer) is partially formed in a surface layer of the p-type semiconductor layer 24. The $n^+$-type semiconductor layer 23 has a higher impurity concentration than the n-type semiconductor substrate 20.

A plurality of trenches 13 penetrating, from the upper surface of the n-type semiconductor substrate 20, the $n^+$-type semiconductor layer 23 and the p-type semiconductor layer 24 to reach the inside of the n-type semiconductor substrate 20 are formed. A gate dielectric 14 is formed on an inner wall of each of the trenches 13. A gate electrode 15 is further formed in a region surrounded by the gate dielectric 14 in each of the trenches 13.

An interlayer dielectric 16 covering an upper surface of the gate electrode 15 is formed. In regions between adjacent interlayer dielectrics 16, a plurality of contact trenches 17 each being deeper than the $n^+$-type semiconductor layer 23, reaching the inside of the p-type semiconductor layer 24, but being shallower than the trenches 13 are formed.

A $p^+$-type semiconductor layer 25 (a contact layer) is formed to be in contact with the bottom of each of the contact trenches 17. The $p^+$-type semiconductor layer 25 has a higher impurity concentration than the p-type semiconductor layer 24. An upper surface of the $p^+$-type semiconductor layer 25 (the contact layer) is located inside the p-type semiconductor layer 24. An emitter electrode contact hole 19 is formed in each of the regions between the interlayer dielectrics 16.

Each of the contact trenches 17 has a width of 50 nm or more, for example. The contact trench 17 has a smaller width than the emitter electrode contact hole 19 through which a part of the upper surface of the n-type semiconductor substrate 20 exposed from the interlayer dielectrics 16 is in contact with an emitter electrode 10.

The cell regions 30 are formed in the upper surface of the n-type semiconductor substrate 20. The cell regions 30 are regions each including the $n^+$-type semiconductor layer 23, the p-type semiconductor layer 24, the gate dielectrics 14, the gate electrodes 15, the interlayer dielectrics 16, the contact trench 17, and the $p^+$-type semiconductor layer 25.

The emitter electrode 10 is formed to cover the cell regions 30. The emitter electrode 10 is connected to the $n^+$-type semiconductor layer 23, the p-type semiconductor layer 24, and the $p^+$-type semiconductor layer 25 through the contact trench 17. The gate electrode 15 is herein insulated from the emitter electrode 10 by the interlayer dielectric 16.

An $n^+$-type buffer layer 21 is formed on the lower surface of the n-type semiconductor substrate 20. The $n^+$-type buffer layer 21 has a higher impurity concentration than the n-type semiconductor substrate 20. A p-type collector layer 22 is formed on a lower surface of the $n^+$-type buffer layer 21. A collector electrode 11 is formed on a lower surface of the p-type collector layer 22.

The effects produced in the present embodiment will be described next through comparison with a comparative example.

Figure 3:
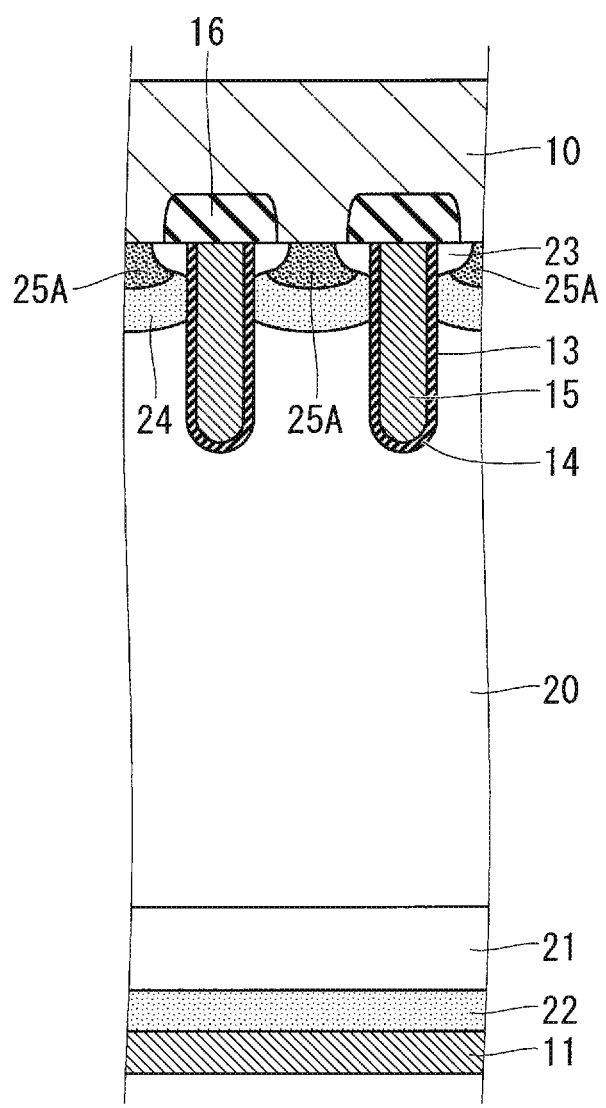
FIG. 3 is a sectional view schematically showing an example of a configuration of a semiconductor device known by the inventor.
Figure 4:
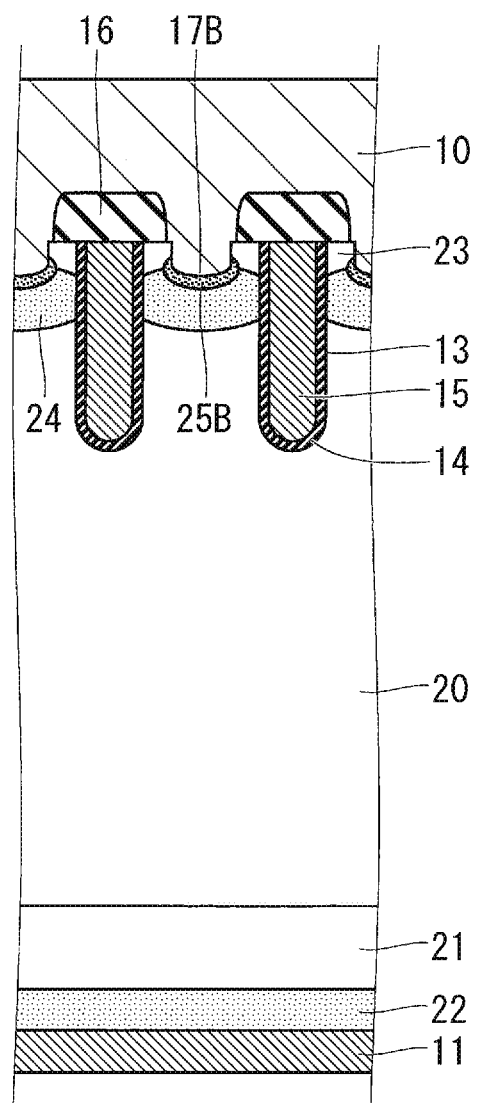
FIG. 4 is a sectional view schematically showing an example of a configuration of the semiconductor device according to the embodiment.
Figure 5:
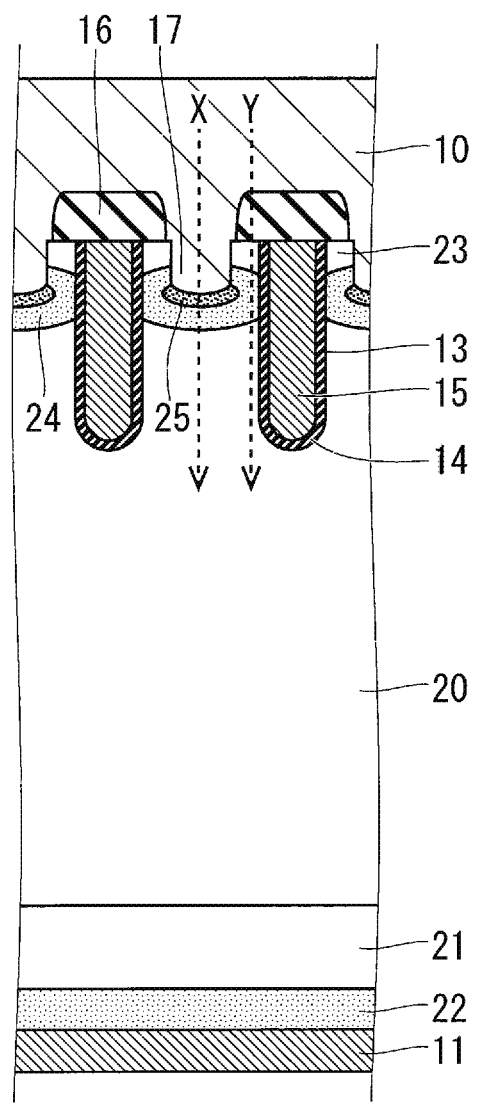
FIG. 5 is a sectional view schematically showing an example of a configuration of the semiconductor device according to the embodiment.

FIG. 3 is a sectional view schematically showing an example of a configuration of a semiconductor device known by the inventor. FIG. 4 is a sectional view schematically showing an example of a configuration of the semiconductor device according to the present embodiment. FIG. 5 is a sectional view schematically showing an example of a configuration of the semiconductor device according to the present embodiment.

As illustrated in FIG. 3, the semiconductor device in FIG. 3 includes the n-type semiconductor substrate 20, the p-type semiconductor layer 24, the $n^+$-type semiconductor layer 23, the trenches 13, the gate dielectrics 14, the gate electrodes 15, the interlayer dielectrics 16, a $p^+$-type semiconductor layer 25A partially formed in the surface layer of the p-type semiconductor layer 24, the emitter electrode 10, the $n^+$-type buffer layer 21, the p-type collector layer 22, and the collector electrode 11. The $p^+$-type semiconductor layer 25A has a higher impurity concentration than the p-type semiconductor layer 24.

As described above, no contact trenches are formed in the semiconductor device in FIG. 3.

As illustrated in FIG. 4, the semiconductor device in FIG. 4 includes the n-type semiconductor substrate 20, the p-type semiconductor layer 24, the $n^+$-type semiconductor layer 23, the trenches 13, the gate dielectrics 14, the gate electrodes 15, the interlayer dielectrics 16, contact trenches 17B formed in the regions between adjacent interlayer dielectrics 16 to each be deeper than the $n^+$-type semiconductor layer 23, reach the inside of the p-type semiconductor layer 24, but be shallower than the trenches 13, a $p^+$-type semiconductor layer 25B formed to be in contact with the bottom of each of the contact trenches 17B, the emitter electrode 10 formed to cover the interlayer dielectrics 16 and the contact trenches 17B, the $n^+$-type buffer layer 21, the p-type collector layer 22, and the collector electrode 11. An upper surface of the $p^+$-type semiconductor layer 25B is located at an upper surface of the p-type semiconductor layer 24. The $p^+$-type semiconductor layer 25B has a higher impurity concentration than the p-type semiconductor layer 24.

The contact trenches 17B are shallower than the contact trenches 17.

The p-type semiconductor layer 24 is a region of formation of an n channel through which the $n^+$-type semiconductor layer 23 and the n-type semiconductor substrate are connected to each other.

The $n^+$-type semiconductor layer 23 is disposed regardless of the presence or absence of the contact trenches 17B and the depth of each of the contact trenches 17B. The p-type semiconductor layer 24 is also formed regardless of the presence or absence of the contact trenches 17B and the depth of each of the contact trenches 17B.

As illustrated in FIG. 5, the semiconductor device in FIG. 5 includes the n-type semiconductor substrate 20, the p-type semiconductor layer 24, the n$^+$-type semiconductor layer 23, the trenches 13, the gate dielectrics 14, the gate electrodes 15, the interlayer dielectrics 16, the contact trenches 17, the p$^+$-type semiconductor layer 25, the emitter electrode 10, the n$^+$-type buffer layer 21, the p-type collector layer 22, and the collector electrode 11. The upper surface of the p$^+$-type semiconductor layer 25 is located inside the p-type semiconductor layer 24.

Figure 11:
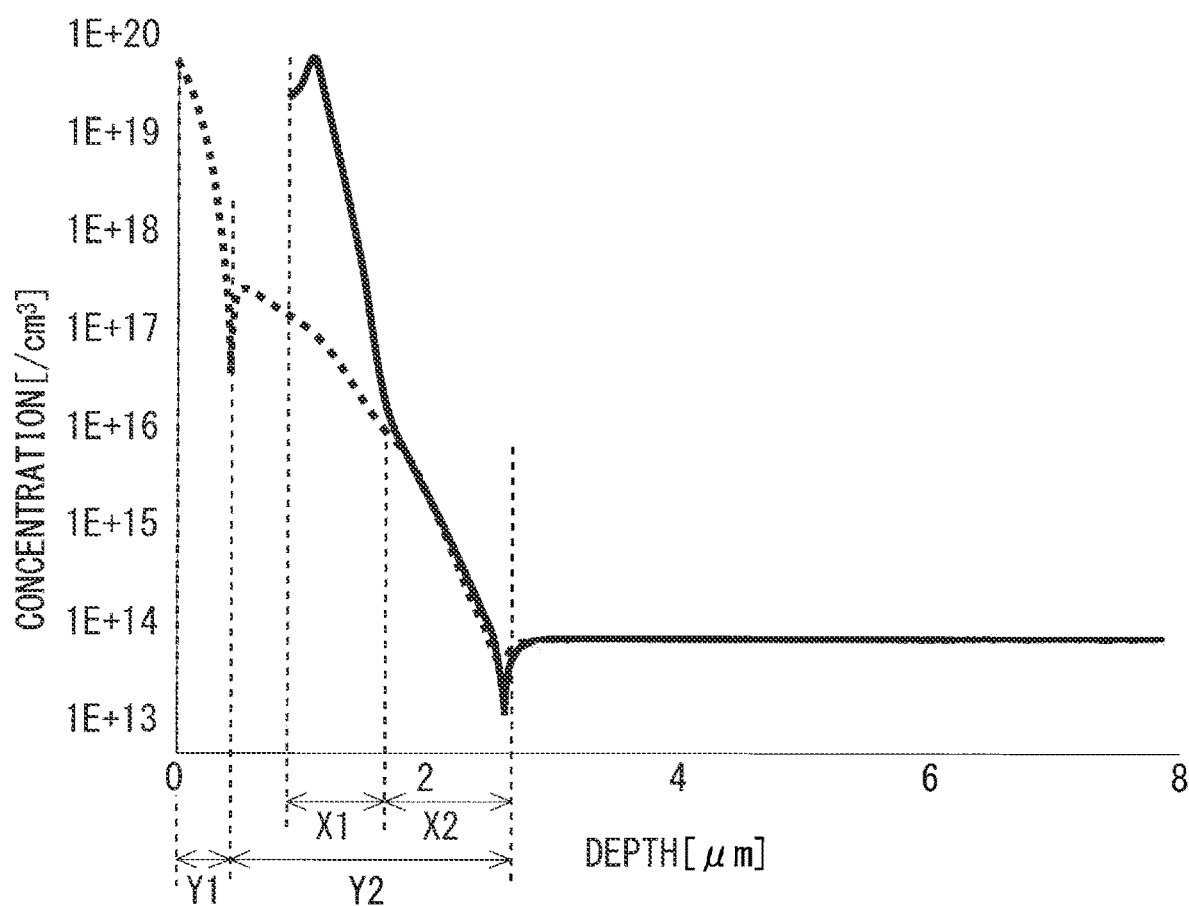
FIG. 11 is a diagram showing concentration profiles along a line X and a line Y of FIG. 5.

FIG. 11 is herein a diagram showing concentration profiles along a line X and a line Y of FIG. 5. In FIG. 11, the vertical axis represents an impurity concentration and the horizontal axis represents a depth [μm].

As shown by a solid line in FIG. 11, the concentration profile along the line X has different concentration gradients in X1 and in X2. This indicates that the p$^+$-type semiconductor layer 25 is formed to have a depth of X1 and the p-type semiconductor layer 24 is formed to have a depth of X2, and the boundary between the p$^+$-type semiconductor layer 25 and the p-type semiconductor layer 24 is clear from the difference in concentration gradient.

As shown by a dotted line in FIG. 11, the concentration profile along the line Y has different concentration gradients in Y1 and in Y2. This indicates that the n$^+$-type semiconductor layer 23 is formed to have a depth of Y1 and the p-type semiconductor layer 24 is formed to have a depth of Y2, and the boundary between the n$^+$-type semiconductor layer 23 and the p-type semiconductor layer 24 is clear from the difference in concentration gradient.

Comparison among FIGS. 3, 4, and 5 shows that the p$^+$-type semiconductor layer 25 (or the p$^+$-type semiconductor layer 25A and the p$^+$-type semiconductor layer 25B) has an influence on the n$^+$-type semiconductor layer 23.

Specifically, as illustrated in FIGS. 3 and 4, the p$^+$-type semiconductor layer 25A and the p$^+$-type semiconductor layer 25B for preventing an IGBT from entering a latch-up operation are responsible for the effects of reducing resistance of a lower surface of the n$^+$-type semiconductor layer 23. On the flip side, impurities in the p$^+$-type semiconductor layer 25A and the p$^+$-type semiconductor layer 25B interfere with the n$^+$-type semiconductor layer 23, and thus a region of formation of the n$^+$-type semiconductor layer 23 is not stabilized. This destabilizes a channel length, and can cause a malfunction as described below.

In an on state of the IGBT, upon application of a forward bias to the collector electrode 11 and application of a forward bias to the gate electrode 15, an inversion layer is formed in the p-type semiconductor layer 24 being in contact with the gate dielectric 14, and a channel is formed. Carrying of a current from the collector electrode 11 to the emitter electrode 10 starts through the channel.

In a case where the channel length is destabilized, the channel is likely to fall in a state in which a current carrying capacity is deteriorated as in a case where a low forward bias is applied to the gate electrode 15 or a state in which the current carrying capacity is excessive as in a case where a high forward bias is applied to the gate electrode 15. This causes deterioration of an on voltage, reduction in short-circuit capability, or the like.

On the other hand, in the semiconductor device illustrated in FIG. 5, interference of the impurities in the p$^+$-type semiconductor layer 25 with the n$^+$-type semiconductor layer 23 is suppressed. The channel is thus less likely to fall in the state in which the current carrying capacity is deteriorated as in a case where the low forward bias is applied to the gate electrode 15.

As described below, the current carrying capacity is suppressed when the high forward bias is applied to the gate electrode 15, and thus the short-circuit capability can be improved without deteriorating the on voltage.

Figure 6:
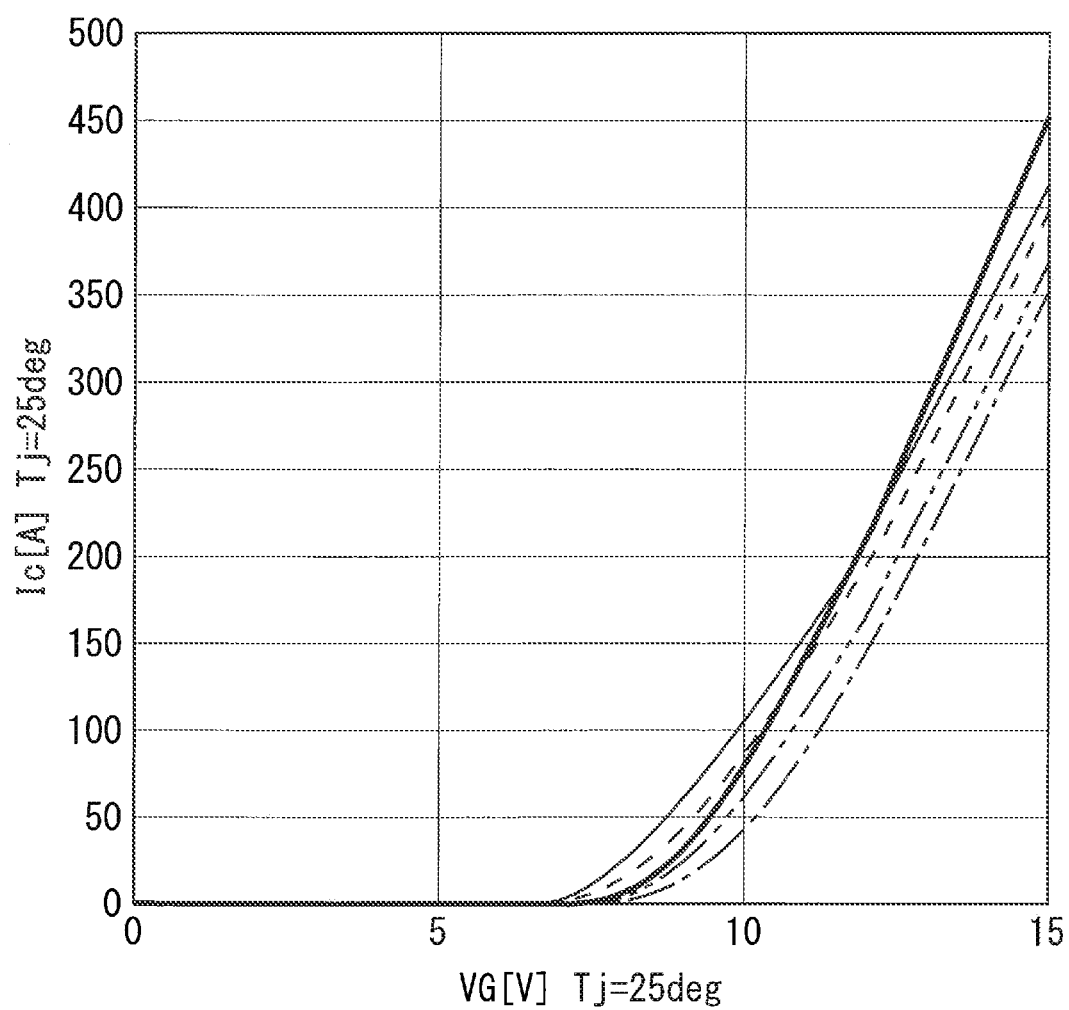
FIG. 6 is a characteristics comparison diagram showing dependence between a collector current and a gate voltage in the semiconductor device illustrated in FIG. 3, the semiconductor device illustrated in FIG. 4, and the semiconductor device illustrated in FIG. 5.

FIG. 6 is a characteristics comparison diagram showing dependence between a collector current and a gate voltage in the semiconductor device including no contact trenches illustrated in FIG. 3, the semiconductor device including the shallow contact trenches 17B illustrated in FIG. 4, and the semiconductor device including the contact trenches 17 illustrated in FIG. 5. In FIG. 6, the vertical axis represents the collector current (Ic) [A], and the horizontal axis represents the gate voltage [VG].

The semiconductor device including no contact trenches illustrated in FIG. 3 is shown by a thick solid line in FIG. 6 as including trenches each having a depth of 0 μm.

Two types of the semiconductor device including the shallow contact trenches 17B illustrated in FIG. 4, that is, a semiconductor device including the trenches each having a depth from the lower surface of the n$^+$-type semiconductor layer 23 of 0.58 μm and a semiconductor device including the trenches each having a depth from the lower surface of the n$^+$-type semiconductor layer 23 of 0.7 μm are respectively shown by an alternate long and short dash line and an alternate long and two short dashes line in FIG. 6.

The depth of the lower surface of the n$^+$-type semiconductor layer 23 can be a depth showing a peak concentration of the n$^+$-type semiconductor layer 23.

Two types of the semiconductor device including the contact trenches 17 illustrated in FIG. 5, that is, a semiconductor device including the trenches each having a depth from the lower surface of the n$^+$-type semiconductor layer 23 of 0.80 μm and a semiconductor device including the trenches each having a depth from the lower surface of the n$^+$-type semiconductor layer 23 of 0.93 μm are respectively shown by a dotted line and a thin solid line in FIG. 6.

FIG. 6 is the characteristics comparison diagram in a case where each of the semiconductor devices (IGBTs) in FIGS. 3, 4, and 5 has a chip size corresponding to a rated current of 100 [A]. A junction temperature (Tj) [deg] is 25 [deg].

In FIG. 6, the gate voltage (VG) represents the forward bias applied to the gate electrode 15, and the collector current (Ic) represents the collector current carried from the collector electrode 11 to the emitter electrode 10.

As illustrated in FIG. 6, comparison among the semiconductor device including no contact trenches illustrated in FIG. 3, the semiconductor device including the shallow contact trenches 17B illustrated in FIG. 4, and the semiconductor device including the contact trenches 17 illustrated in FIG. 5 shows that the collector current (Ic) when the gate voltage (VG) is 15 [V] is lower in the semiconductor device including the shallow contact trenches 17B illustrated in FIG. 4 and in the semiconductor device including the contact trenches 17 illustrated in FIG. 5 than in the semiconductor device including no contact trenches illustrated in FIG. 3.

That is to say, according to the semiconductor device including the shallow contact trenches 17B illustrated in FIG. 4 and the semiconductor device including the contact trenches 17 illustrated in FIG. 5, the amount of heat generated per unit time when a short circuit occurs can be reduced. An un-destructed time (i.e., a time taken to cause destruction) when the short circuit occurs can thus be increased to increase the short-circuit capability.

A method of increasing a threshold voltage typically used to suppress a saturation current can herein cause an increase in switching loss.

In an IGBT having a trench gate structure, there is an unintended parasitic resistance immediately under an n$^+$-type emitter layer (the n$^+$-type semiconductor layer 23).

When the IGBT is energized, a current flows from a collector electrode to an emitter electrode, and also flows immediately under the n$^+$-type emitter layer.

In this case, a current flows through the parasitic resistance to cause a potential difference across the n$^+$-type emitter layer (e.g., on a side of the trench 13 and on a side of the contact trench 17 at the lower surface of the n$^+$-type semiconductor layer 23 in FIG. 5).

When the potential difference exceeds a built-in potential between the n$^+$-type emitter layer (the n$^+$-type semiconductor layer 23) and a p-type base layer (the p-type semiconductor layer 24), the IGBT enters the latch-up operation, and can cause destruction of the semiconductor device.

To solve the problem, the method of increasing the threshold voltage, for example, by increasing impurity concentration of the p-type base layer (the p-type semiconductor layer 24) has been used. The latch-up operation is thereby suppressed.

The method of increasing the threshold voltage, however, can cause the increase in switching loss.

In contrast, it can be seen, with reference to a case where the collector current (Ic) is a rated current of 100 [A] in FIG. 6, that the gate voltage (VG) in the semiconductor device including the contact trenches 17 illustrated in FIG. 5 is equal to or lower than the gate voltage (VG) in the semiconductor device including no contact trenches illustrated in FIG. 3 and the gate voltage (VG) in the semiconductor device including the shallow contact trenches 17B illustrated in FIG. 4.

That is to say, according to the configuration illustrated in FIG. 5, the gate voltage (VG) required in the case where the collector current (Ic) is the rated current of 100 [A] decreases, the semiconductor device is easily turned to be in the on state, and a turn-on loss (i.e., the switching loss) can be reduced.

FIG. 7 is a diagram showing a correlation between the depth of each of the contact trenches from the lower surface of the n$^+$-type semiconductor layer 23 and a turn-on loss ratio at the rated current in the semiconductor device (IGBT) including no contact trenches illustrated in FIG. 3, the semiconductor device (IGBT) including the shallow contact trenches 17B illustrated in FIG. 4, and the semiconductor device (IGBT) including the contact trenches 17 illustrated in FIG. 5. In FIG. 7, the vertical axis represents the turn-on loss ratio, and the horizontal axis represents a trench depth [μm].

The semiconductor device including no contact trenches illustrated in FIG. 3 is shown by a black circle in FIG. 7 as including trenches each having a depth of 0 μm.

The two types of the semiconductor device including the shallow contact trenches 17B illustrated in FIG. 4, that is, the semiconductor device including the trenches each having a depth from the lower surface of the n$^+$-type semiconductor layer 23 of 0.58 μm and the semiconductor device including the trenches each having a depth from the lower surface of the n$^+$-type semiconductor layer 23 of 0.7 μm are respectively shown by a black square and a black triangle in FIG. 7.

The two types of the semiconductor device including the contact trenches 17 illustrated in FIG. 5, that is, the semiconductor device including the trenches each having a depth from the lower surface of the n$^+$-type semiconductor layer 23 of 0.80 μm and the semiconductor device including the trenches each having a depth from the lower surface of the n$^+$-type semiconductor layer 23 of 0.93 μm are respectively shown by a white circle and a white square in FIG. 7.

As illustrated in FIG. 7, in a case where the turn-on loss (i.e., the switching loss) in the semiconductor device including no contact trenches illustrated in FIG. 3 is set to 1, it can be seen that the turn-on loss (i.e., the switching loss) tends to decrease in the semiconductor device including the contact trenches 17 each having a depth of at least 0.80 μm illustrated in FIG. 5.

That is to say, as described with reference to FIG. 6, according to the configuration illustrated in FIG. 5, the turn-on loss (i.e., the switching loss) can be reduced while suppressing the saturation current to improve the short-circuit capability.

Second Embodiment

A semiconductor device according to the present embodiment will be described below. In description made below, similar components to those described in the above-mentioned embodiment bear the same reference signs as those in the above-mentioned embodiment, and detailed description thereof is omitted as appropriate.

<Configuration of Semiconductor Device>

Figure 8:
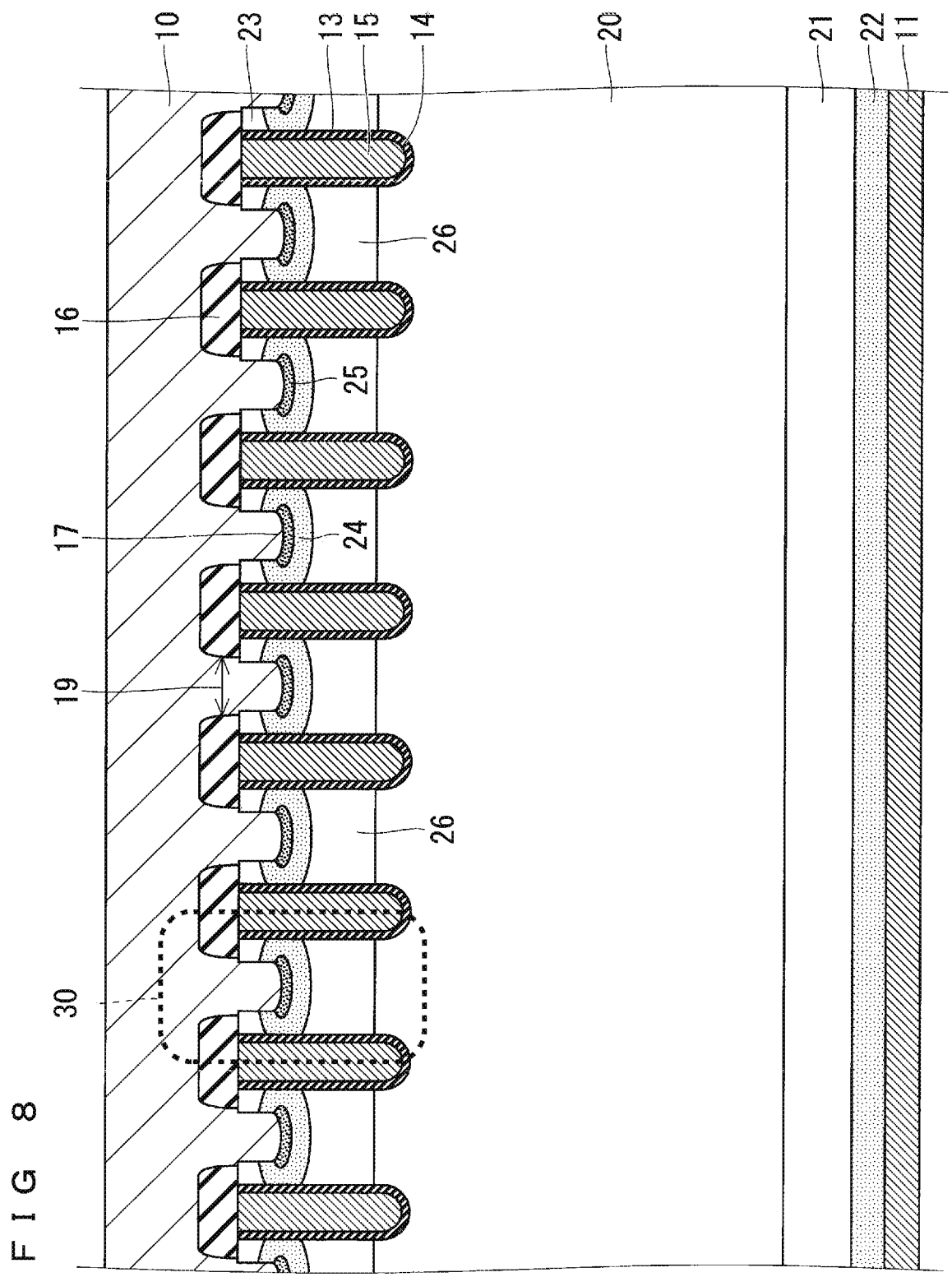
FIG. 8 is a sectional view schematically showing an example of a configuration of the semiconductor device according to the embodiment.

FIG. 8 is a sectional view schematically showing an example of a configuration of the semiconductor device according to the present embodiment. FIG. 8 corresponds to a sectional view taken along the line A-A' of FIG. 1.

As illustrated in FIG. 8, the semiconductor device in FIG. 8 includes the n-type semiconductor substrate 20, the p-type semiconductor layer 24, the n$^+$-type semiconductor layer 23, the trenches 13, the gate dielectrics 14, the gate electrodes 15, the interlayer dielectrics 16, the contact trenches 17, the p$^+$-type semiconductor layer 25, the emitter electrode 10, the n$^+$-type buffer layer 21, the p-type collector layer 22, the collector electrode 11, and an n$^+$-type semiconductor layer 26 (a carrier accumulation layer) formed to be in contact with a lower surface of the p-type semiconductor layer 24. The n$^+$-type semiconductor layer 26 has a higher impurity concentration than the n-type semiconductor substrate 20.

According to the semiconductor device illustrated in FIG. 8, holes supplied from the p-type collector layer 22 when the semiconductor device is energized are accumulated in the n$^+$-type semiconductor layer 26 (the carrier accumulation layer). Conductivity can thus be reduced to reduce an on resistance.

Figure 9:
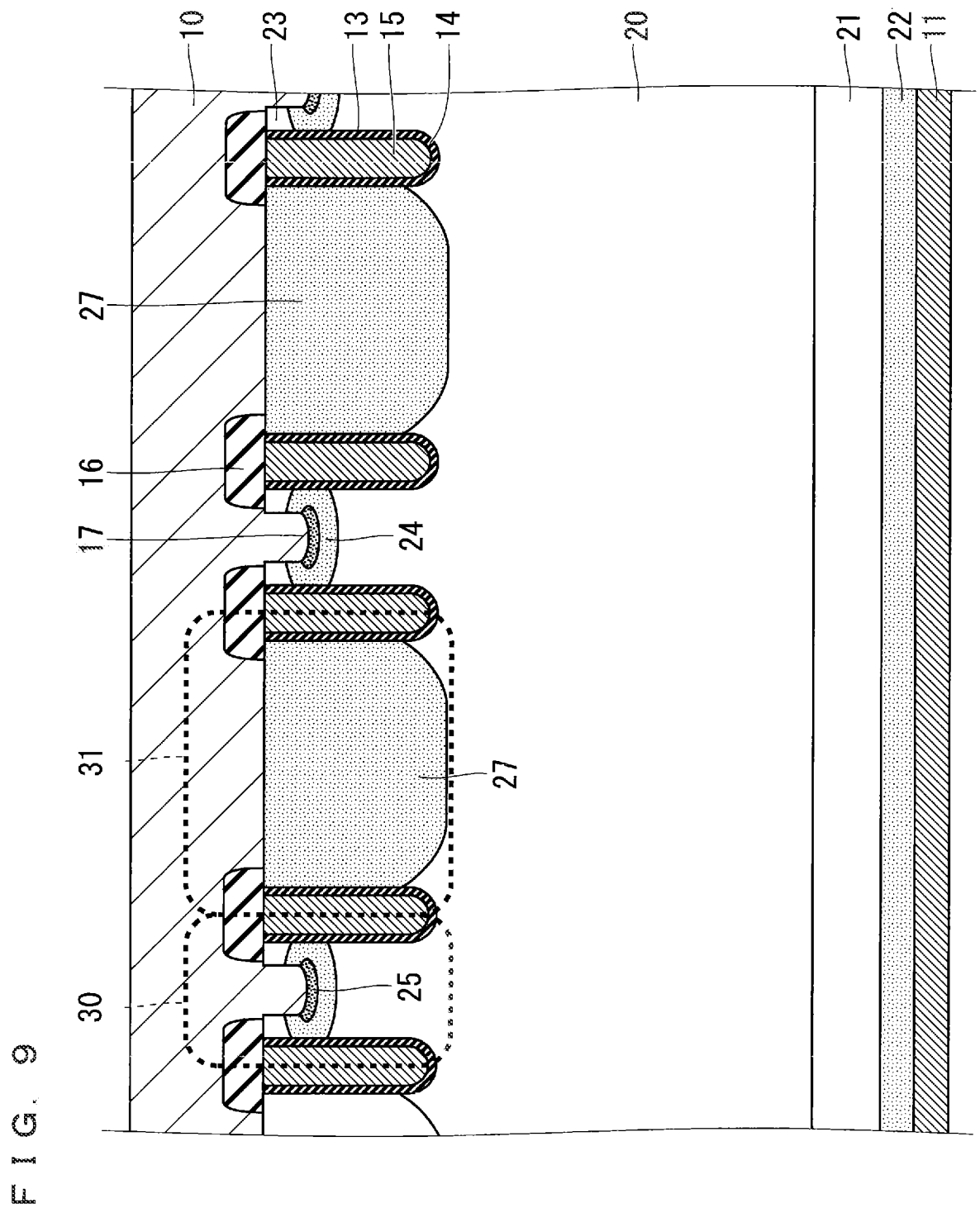
FIG. 9 is a sectional view schematically showing an example of another configuration of the semiconductor device according to the embodiment.

FIG. 9 is a sectional view schematically showing an example of another configuration of the semiconductor device according to the present embodiment. FIG. 9 corresponds to a sectional view taken along the line A-A' of FIG. 1.

As illustrated in FIG. 9, in the semiconductor device in FIG. 9, the cell regions and thinned-out cell regions 31 are formed alternately with the trenches 13 therebetween in a surface layer of the n-type semiconductor substrate 20. The semiconductor device in FIG. 9 further includes the emitter electrode 10, the n$^+$-type buffer layer 21, the p-type collector layer 22, and the collector electrode 11.

In the cell regions 30, the n$^+$-type semiconductor layer 23, the p-type semiconductor layer 24, the gate dielectrics 14, the gate electrodes 15, the interlayer dielectrics 16, the contact trenches 17, and the p$^+$-type semiconductor layer 25 are formed.

On the other hand, in each of the thinned-out cell regions 31, a p-type semiconductor layer 27 (a carrier accumulation layer) is formed in the surface layer of the n-type semiconductor substrate 20. In the thinned-out cell regions 31, the contact trenches 17 are not formed.

In the semiconductor device illustrated in FIG. 9, the number of trenches 13 is greater than the number of contact trenches 17.

According to the semiconductor device illustrated in FIG. 9, holes supplied from the p-type collector layer 22 when the semiconductor device is energized are accumulated in the p-type semiconductor layer 27 (the carrier accumulation layer). Conductivity can thus be reduced to reduce the on resistance.

Figure 10:
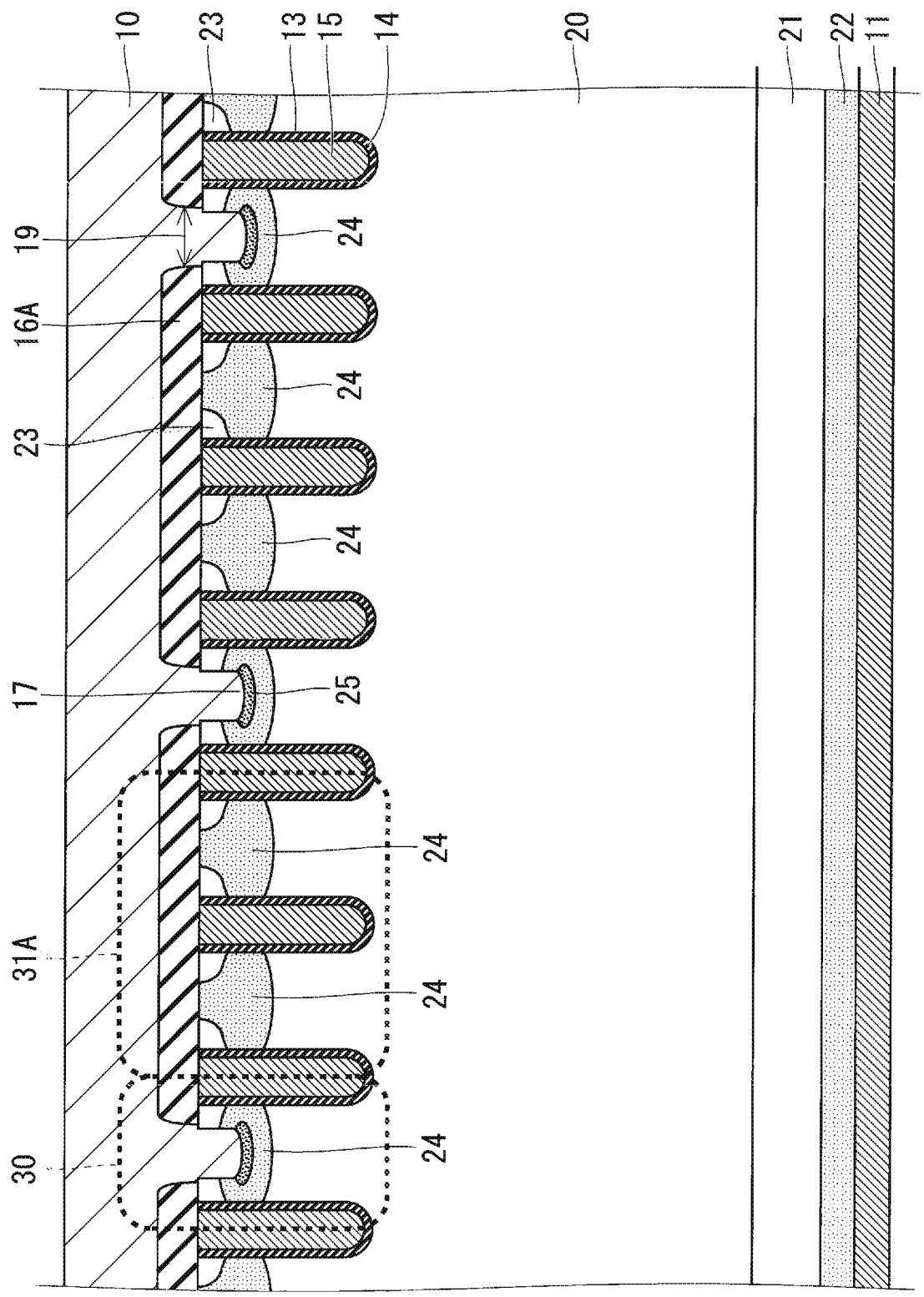
FIG. 10 is a sectional view schematically showing an example of yet another configuration of the semiconductor device according to the embodiment.

FIG. 10 is a sectional view schematically showing an example of yet another configuration of the semiconductor device according to the present embodiment. FIG. corresponds to a sectional view taken along the line A-A' of FIG. 1.

As illustrated in FIG. 10, in the semiconductor device in FIG. 10, the cell regions 30 and thinned-out cell regions 31A are formed alternately with the trenches 13 therebetween in the surface layer of the n-type semiconductor substrate 20. In FIG. 10, however, the thinned-out cell regions 31A are each formed across two regions between the trenches 13. The semiconductor device in FIG. 10 further includes the emitter electrode 10, the $n^+$-type buffer layer 21, the p-type collector layer 22, and the collector electrode 11.

In the cell regions 30, the $n^+$-type semiconductor layer 23, the p-type semiconductor layer 24, the gate dielectrics 14, the gate electrodes 15, interlayer dielectrics 16A covering the upper surfaces of the gate electrodes 15, the contact trenches 17, and the $p^+$-type semiconductor layer 25 are formed.

On the other hand, in the thinned-out cell regions 31A, the $n^+$-type semiconductor layer 23, the p-type semiconductor layer 24, and interlayer dielectrics 16A covering the upper surfaces of the gate electrodes 15, an upper surface of the $n^+$-type semiconductor layer 23, and the upper surface of the p-type semiconductor layer 24 are formed, but the $p^+$-type semiconductor layer 25 and the contact trenches 17 are not formed.

In the semiconductor device illustrated in FIG. 10, the number of trenches 13 is greater than the number of contact trenches 17.

According to the semiconductor device illustrated in FIG. 10, holes supplied from the p-type collector layer 22 when the semiconductor device is energized are accumulated in regions in which the emitter electrode contact holes 19 are not provided, that is, in the thinned-out cell regions 31A. Conductivity can thus be reduced to reduce the on resistance.

Effects Produced by Embodiments Described Above

Examples of the effects produced by the embodiments described above will be shown next. In description made below, the effects are described based on a specific configuration exemplified in the embodiments described above, but the specific configuration may be replaced by another specific configuration exemplified in the present application within the scope in which similar effects are produced.

The replacement may be made across a plurality of embodiments. That is to say, configurations exemplified in different embodiments may be combined with each other to produce similar effects.

According to the embodiments described above, the semiconductor device includes a first semiconductor layer of a first conductivity type (an n-type), a second semiconductor layer of a second conductivity type (a p-type), a third semiconductor layer of the first conductivity type, at least one first trench, a gate dielectric 14, a gate electrode 15, an interlayer dielectric 16 (or an interlayer dielectric 16A), at least one second trench, a fourth semiconductor layer of the second conductivity type, and an electrode layer. Herein, the first semiconductor layer corresponds to the n-type semiconductor substrate 20, for example. The second semiconductor layer corresponds to the p-type semiconductor layer 24, for example. The third semiconductor layer corresponds to the $n^+$-type semiconductor layer 23, for example. The first trench corresponds to each of the trenches 13, for example. The second trench corresponds to each of the contact trenches 17 or each of the contact trenches 17B, for example. The fourth semiconductor layer corresponds to the $p^+$-type semiconductor layer 25 or the $p^+$-type semiconductor layer 25B, for example. The electrode layer corresponds to the emitter electrode 10, for example. The p-type semiconductor layer 24 is formed in the surface layer of the n-type semiconductor substrate 20. The $n^+$-type semiconductor layer 23 is formed in the surface layer of the p-type semiconductor layer 24. The trenches 13 are each formed to penetrate, from the upper surface of the n-type semiconductor substrate 20, the p-type semiconductor layer 24 and the $n^+$-type semiconductor layer 23 to reach the inside of the n-type semiconductor substrate 20. The gate dielectric 14 is formed on the inner wall of each of the trenches 13. The gate electrode 15 is formed inside the gate dielectric 14 in each of the trenches 13. The interlayer dielectric 16 is formed to cover the gate electrode 15. The contact trenches 17B are each formed to penetrate, from the part of the upper surface of the n-type semiconductor substrate 20 exposed from the interlayer dielectrics 16, the $n^+$-type semiconductor layer 23 to reach the inside of the p-type semiconductor layer 24. The $p^+$-type semiconductor layer 25B is formed to be in contact with the bottom of each of the contact trenches 17B. The emitter electrode 10 is formed to cover the interlayer dielectrics 16 and the contact trenches 17B.

According to a configuration as described above, the saturation current can be suppressed, that is to say, the amount of heat generated per unit time when the short circuit occurs can be reduced to improve the short-circuit capability. Specifically, the contact trenches 17B are formed to be deeper than the $n^+$-type semiconductor layer 23 to suppress the current flowing immediately under the $n^+$-type semiconductor layer 23 and to suppress the built-in potential between the $n^+$-type semiconductor layer 23 and the p-type semiconductor layer 24. Latch-up withstanding capability can thereby be improved. Furthermore, the $p^+$-type semiconductor layer 25B is formed at the bottom of each of the contact trenches 17B to suppress an excessive increase in threshold voltage.

Similar effects can be produced in a case where at least one of other configurations exemplified in the present application, that is, another configuration not referred to as the configuration described above but exemplified in the present application is added to the configuration described above as appropriate.

According to the embodiments described above, the upper surface of the $p^+$-type semiconductor layer 25 is located inside the p-type semiconductor layer 24. According to a configuration as described above, the semiconductor device is easily turned to be in the on state, and the turn-on loss (i.e., the switching loss) can be reduced.

According to the embodiments described above, the bottom of each of the contact trenches 17 is at a location at least 0.8 µm deeper than the lower surface of the $n^+$-type semiconductor layer 23. According to a configuration as described above, the semiconductor device is easily turned to be in the on state, and the turn-on loss (i.e., the switching loss) can be reduced.

According to the embodiments described above, each of the contact trenches 17 has a smaller width than each of contact holes through which the part of the upper surface of the n-type semiconductor substrate 20 exposed from the interlayer dielectrics 16 is in contact with the emitter electrode 10. The contact holes herein correspond to the emitter electrode contact holes 19, for example. According to a configuration as described above, an influence of the $p^+$-type semiconductor layer 25 or the $p^+$-type semiconductor layer 25B on the channel can be suppressed to suppress an unnecessary increase in threshold voltage.

According to the embodiments described above, each of the contact trenches 17 has a width of 50 nm or more. According to a configuration as described above, a location of formation of the $p^+$-type semiconductor layer 24 can be stabilized to stabilize the length of the channel as formed. The built-in potential between the $n^+$-type semiconductor layer 23 and the p-type semiconductor layer 24 can surely be suppressed.

According to the embodiments described above, the semiconductor device includes a fifth semiconductor layer of the first conductivity type (the n-type) formed to be in contact with the lower surface of the p-type semiconductor layer 24. The fifth semiconductor layer herein corresponds to the $n^+$-type semiconductor layer 26, for example. According to a configuration as described above, holes supplied from the p-type collector layer 22 when the semiconductor device is energized can be accumulated in the $n^+$-type semiconductor layer 26, and thus conductivity can be reduced to reduce the on resistance.

According to the embodiments described above, the semiconductor device includes the trenches 13 and the contact trenches 17. The number of trenches 13 is greater than the number of contact trenches 17. According to a configuration as described above, holes supplied from the p-type collector layer 22 when the semiconductor device is energized are accumulated in the regions in which the emitter electrode contact holes 19 are not provided. Conductivity can thus be reduced to reduce the on resistance.

According to the embodiments described above, first cell regions are regions each sandwiched between two of the trenches 13 and including the p-type semiconductor layer 24, the $n^+$-type semiconductor layer 23, the $p^+$-type semiconductor layer 25, and the contact trench 17, and second cell regions are regions each sandwiched between two of the trenches 13 and including a sixth semiconductor layer of the second conductivity type (the p-type) formed in the surface layer of the n-type semiconductor substrate 20. Herein, the first cell regions correspond to the cell regions 30, for example. The sixth semiconductor layer corresponds to the p-type semiconductor layer 27, for example. The second cell regions correspond to the thinned-out cell regions 31, for example. The cell regions 30 and the thinned-out cell regions 31 are each arranged in the surface layer of the n-type semiconductor substrate 20. According to a configuration as described above, holes supplied from the p-type collector layer 22 when the semiconductor device is energized can be accumulated in the p-type semiconductor layer 27, and thus conductivity can be reduced to reduce the on resistance.

According to the embodiments described above, the cell regions 30 and the thinned-out cell regions 31 are arranged alternately. According to a configuration as described above, holes supplied from the p-type collector layer 22 when the semiconductor device is energized can be accumulated in the p-type semiconductor layer 27, and thus conductivity can be reduced to reduce the on resistance.

According to the embodiments described above, the cell regions 30 are the regions each sandwiched between two of the trenches 13 and including the p-type semiconductor layer 24, the $n^+$-type semiconductor layer 23, the $p^+$-type semiconductor layer 25, and the contact trench 17, and the second cell regions are regions each sandwiched between two of the trenches 13, including the p-type semiconductor layer 24 and the $n^+$-type semiconductor layer 23, and not including the $p^+$-type semiconductor layer 25 and the contact trench 17. The second cell regions herein correspond to the thinned-out cell regions 31A, for example. The cell regions 30 and the thinned-out cell regions 31A are each arranged in the surface layer of the n-type semiconductor substrate 20. According to a configuration as described above, holes supplied from the p-type collector layer 22 when the semiconductor device is energized are accumulated in the regions in which the emitter electrode contact holes 19 are not provided, that is, in the thinned-out cell regions 31A. Conductivity can thus be reduced to reduce the on resistance.

According to the embodiments described above, the cell regions 30 are arranged with two thinned-out cell regions 31A therebetween. According to a configuration as described above, holes supplied from the p-type collector layer 22 when the semiconductor device is energized are accumulated in the regions in which the emitter electrode contact holes 19 are not provided, that is, in the thinned-out cell regions 31A. Conductivity can thus be reduced to reduce the on resistance.

Modifications of Embodiments Described Above

In the embodiments described above, material qualities of, materials for, dimensions of, shapes of, a relative positional relationship among, or conditions for performance of components are described in some cases, but they are each one example in all aspects, and are not limited to those described in the present application.

Numerous modifications not having been exemplified and the equivalent can be devised within the scope of the technology disclosed in the present application. For example, a case where at least one component is modified, added, or omitted and, further, a case where at least one component in at least one embodiment is extracted and combined with components in another embodiment are included.

The number of components described in the above-mentioned embodiments to be "one" may be "one or more" unless any contradiction occurs.

Each component in the embodiments described above is a conceptual unit. A case where a single component includes a plurality of structures, a case where a single component corresponds to a part of a structure, and, further, a case where a plurality of components are included in a single structure are included within the scope of the technology disclosed in the present application.

Each component in the embodiments described above may include a structure having another configuration or shape as long as it fulfills the same function.

Description in the present application is referred to for all purposes relating to the technology, and is not admitted to be prior art.

In a case where a name of a material and the like are described in the above-mentioned embodiments without being particularly designated, an alloy and the like including an additive in addition to the material may be included unless any contradiction occurs.

In the embodiments described above, an IGBT is described as an example of the semiconductor device, but a case where an example of the semiconductor device is a metal-oxide-semiconductor field-effect transistor (MOSFET) can also be devised.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a first semiconductor layer of a first conductivity type;
a second semiconductor layer of a second conductivity type in a surface layer of the first semiconductor layer;
a third semiconductor layer of the first conductivity type in a surface layer of the second semiconductor layer;
a plurality of first trenches penetrating, from an upper surface of the first semiconductor layer, the second semiconductor layer and the third semiconductor layer to reach an inside of the first semiconductor layer;
a gate dielectric on an inner wall of the first trench;
a gate electrode inside the gate dielectric in the first trench;
an interlayer dielectric covering the gate electrode;
a plurality of second trenches penetrating, from a part of the upper surface of the first semiconductor layer exposed from the interlayer dielectric, the third semiconductor layer to reach an inside of the second semiconductor layer;
a fourth semiconductor layer of the second conductivity type in contact with a bottom of the second trench;
an electrode layer covering the interlayer dielectric and the second trench; and
one or more first cell regions and one or more second cell regions are each arranged in the surface layer of the first semiconductor layer, wherein
the first cell regions are regions each sandwiched between two of the first trenches and including the second semiconductor layer, the third semiconductor layer, the fourth semiconductor layer, and the second trench, and
the second cell regions are regions each sandwiched between two of the first trenches and including a sixth semiconductor layer of the second conductivity type in the surface layer of the first semiconductor layer.

2. The semiconductor device according to claim 1, wherein
an upper surface of the fourth semiconductor layer is inside the second semiconductor layer.

3. The semiconductor device according to claim 1, wherein
the bottom of the second trench is at a location at least 0.8 μm deeper than a lower surface of the third semiconductor layer.

4. The semiconductor device according to claim 1, wherein
the second trench has a smaller width than a contact hole through which the part of the upper surface of the first semiconductor layer exposed from the interlayer dielectric is in contact with the electrode layer.

5. The semiconductor device according to claim 1, wherein
the second trench has a width of 50 nm or more.

6. A semiconductor device comprising:
a first semiconductor layer of a first conductivity type;
a second semiconductor layer of a second conductivity type in a surface layer of the first semiconductor layer;
a third semiconductor layer of the first conductivity type in a surface layer of the second semiconductor layer;
at least one first trench penetrating, from an upper surface of the first semiconductor layer, the second semiconductor layer and the third semiconductor layer to reach an inside of the first semiconductor layer;
a gate dielectric on an inner wall of the first trench;
a gate electrode inside the gate dielectric in the first trench;
an interlayer dielectric covering the gate electrode;
at least one second trench penetrating, from a part of the upper surface of the first semiconductor layer exposed from the interlayer dielectric, the third semiconductor layer to reach an inside of the second semiconductor layer;
a fourth semiconductor layer of the second conductivity type in contact with a bottom of the second trench;
an electrode layer covering the interlayer dielectric and the second trench; and
a fifth semiconductor layer of the first conductivity type in contact with a lower surface of the second semiconductor layer.

7. The semiconductor device according to claim 1, wherein
the number of first trenches is greater than the number of second trenches.

8. The semiconductor device according to claim 1, wherein
the first cell regions and the second cell regions are arranged alternately.

9. A semiconductor device comprising:
a first semiconductor layer of a first conductivity type;
a second semiconductor layer of a second conductivity type in a surface layer of the first semiconductor layer;
a third semiconductor layer of the first conductivity type in a surface layer of the second semiconductor layer;
at least one first trench penetrating, from an upper surface of the first semiconductor layer, the second semiconductor layer and the third semiconductor layer to reach an inside of the first semiconductor layer;
a gate dielectric on an inner wall of the first trench;
a gate electrode inside the gate dielectric in the first trench;
an interlayer dielectric covering the gate electrode;
at least one second trench penetrating, from a part of the upper surface of the first semiconductor layer exposed from the interlayer dielectric, the third semiconductor layer to reach an inside of the second semiconductor layer;
a fourth semiconductor layer of the second conductivity type in contact with a bottom of the second trench;
an electrode layer covering the interlayer dielectric and the second trench; and
one or more first cell regions and one or more second cell regions are each arranged in the surface layer of the first semiconductor layer, wherein
the at least one first trench comprises a plurality of first trenches,
the at least one second trench comprises a plurality of second trenches,
the number of first trenches is greater than the number of second trenches, where the first cell regions are regions each sandwiched between two of the first trenches and including the second semiconductor layer, the third semiconductor layer, the fourth semiconductor layer, and the second trench, and the second cell regions are regions each sandwiched between two of the first trenches, including the second semiconductor layer and the third semiconductor layer, and not including the fourth semiconductor layer and the second trench.

10. The semiconductor device according to claim 9, wherein
the first cell regions are arranged with two of the second cell regions therebetween.

11. The semiconductor device according to claim 6, wherein
an impurity concentration of the fifth semiconductor layer is higher than an impurity concentration of the first semiconductor layer.

* * * * *